United States Patent
Nakata

(10) Patent No.: US 11,184,004 B2
(45) Date of Patent: Nov. 23, 2021

(54) SEMICONDUCTOR INTEGRATED CIRCUIT DEVICE

(71) Applicant: DENSO CORPORATION, Kariya (JP)

(72) Inventor: Shinichiro Nakata, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/070,172

(22) Filed: Oct. 14, 2020

(65) Prior Publication Data

US 2021/0028786 A1 Jan. 28, 2021

Related U.S. Application Data

(63) Continuation of application No. PCT/JP2019/009699, filed on Mar. 11, 2019.

(30) Foreign Application Priority Data

Apr. 17, 2018 (JP) .............................. JP2018-079099

(51) Int. Cl.
*H03K 19/0185* (2006.01)
*H03K 19/003* (2006.01)

(52) U.S. Cl.
CPC ............... *H03K 19/018521* (2013.01); *H03K 19/00315* (2013.01)

(58) Field of Classification Search
CPC ..... H03K 19/018521; H03K 19/00315; H03K 19/0175; H03K 19/0185; H01L 21/822; H01L 27/04
USPC ....................................................... 326/103
See application file for complete search history.

(56) References Cited

U.S. PATENT DOCUMENTS

| 2008/0303497 | A1 | 12/2008 | Taguchi et al. | |
|---|---|---|---|---|
| 2010/0045250 | A1* | 2/2010 | Aiura | H02M 1/32 323/282 |
| 2011/0002073 | A1* | 1/2011 | Fukuda | H03F 3/2173 361/87 |
| 2014/0184322 | A1* | 7/2014 | Tseng | H01L 25/0657 327/566 |
| 2014/0185174 | A1* | 7/2014 | Tseng | H02H 3/20 361/91.1 |
| 2014/0248514 | A1* | 9/2014 | Ono | H02J 7/0029 429/7 |

(Continued)

FOREIGN PATENT DOCUMENTS

| JP | S61-140611 U | 8/1986 |
|---|---|---|
| JP | H06_112799 A | 4/1994 |
| JP | 4475257 B2 | 6/2010 |

*Primary Examiner* — Don P Le
(74) *Attorney, Agent, or Firm* — Posz Law Group, PLC

(57) ABSTRACT

A semiconductor integrated circuit device includes digital output terminals and output circuits. Each output circuit includes a switch, and applies a potential, which corresponds to either one of binary logic levels, to corresponding one of the digital output terminals through the switch. An indefinite range is interposed between one of the binary logic levels and the other one of the binary logic levels. The output circuits respectively include potential fixers. Each potential fixer has an identical circuit arrangement, and the potential fixer fixes a potential applied to the digital output terminals through the switch to a potential corresponding to either one of the binary logic levels apart from the indefinite range, in response to that a short circuit occurs between the digital output terminals.

14 Claims, 9 Drawing Sheets

(56) References Cited

U.S. PATENT DOCUMENTS

2018/0331678 A1\* 11/2018 Kaneda ................ H02H 1/0007
2020/0365346 A1\* 11/2020 Telefus ................ H02H 1/0007
2020/0373751 A1\* 11/2020 Tseng ................... H02H 1/0007

\* cited by examiner

FIG. 4

$(V_o=)VDD$ ——————
[H]
$0.7*VDD$ ——————

INDEFINITE $0.3*VDD$ ——————
[L]
GND ——————

FIG. 5

$(V_o=)VDD$ ——————
[H]
$VDD-0.7V$ ——————
$(VDD-V_t)$

INDEFINITE $0.7V$ ——————
$(V_t)$
[L]
GND ——————

SEMICONDUCTOR INTEGRATED CIRCUIT DEVICE

CROSS REFERENCE TO RELATED APPLICATIONS

The present application is a continuation application of International Patent Application No. PCT/JP2019/009699 filed on Mar. 11, 2019, which designated the U.S. and claims the benefit of priority from Japanese Patent Application No. 2018-079099 filed on Apr. 17, 2018. The entire disclosures of all of the above applications are incorporated herein by reference.

TECHNICAL FIELD

The present disclosure relates to a semiconductor integrated circuit device.

BACKGROUND

A semiconductor integrated circuit device may be formed by integrating a large number of circuits inside a main part of the semiconductor integrated circuit device, and a digital output circuit may be formed at a digital output terminal of the semiconductor integrated circuit device.

SUMMARY

The present disclosure describes a semiconductor integrated circuit device including multiple digital output terminals being adjacent to each other.

BRIEF DESCRIPTION OF DRAWINGS

The present disclosure will become more apparent from the following detailed description made with reference to the accompanying drawings. In the drawings:

FIG. 4 is a first illustrative diagram of potentials of binary logic levels received by the external circuit;

FIG. 5 is a second illustrative diagram of the potential of the binary logic levels received by the external circuit;

DETAILED DESCRIPTION

Figure 1:
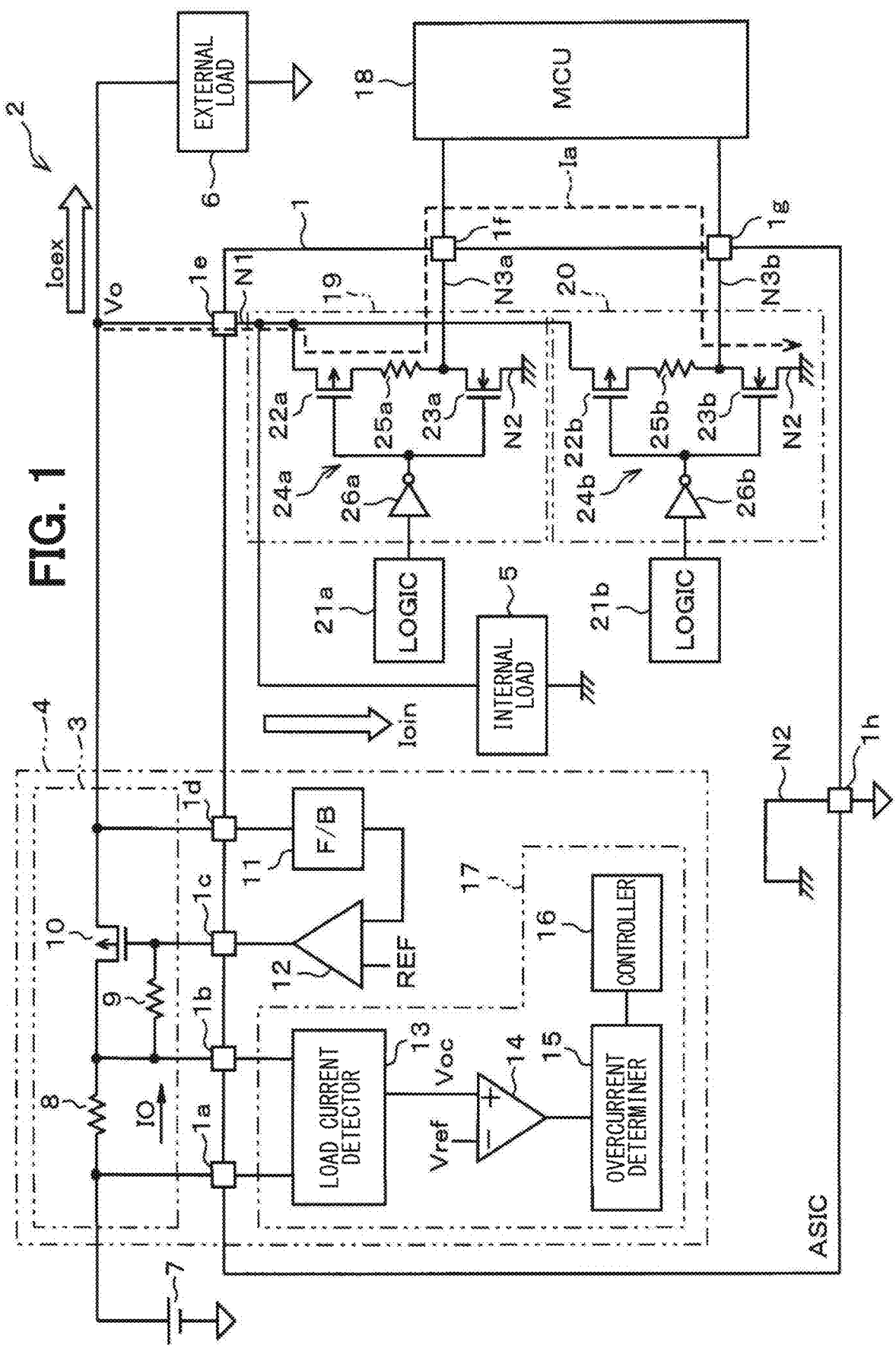
FIG. 1 is an electrical configuration diagram of a semiconductor integrated circuit device according to a first embodiment.

A digital output circuit may apply a potential to a digital output terminal by use of, for example, a CMOS inverter circuit to transmit a binary logical level (H/L level), which is a digital level, to an external circuit.

When the digital output terminals are disposed adjacent to each other, conductive foreign matter may remain between the multiple digital output terminals when the digital output terminals are mounted by, for example, flow soldering, so that the digital output terminals may be short-circuited. Then, a potential of the digital output terminals may become indefinite. In that situation, even if an external circuit receives the potential of the digital output terminals, the external circuit may not comprehend which of binary logic levels the potential corresponds, and an unstable operation may happen.

In addition, an overcurrent may flow between the adjacent digital output terminals. However, if the overcurrent is detected in a main part of the semiconductor integrated circuit device and all operation is stopped, the other control operation may be affected and a necessary control may not be executed. For example, if all the controls in the vehicle are stopped, the control required for the control operation of the vehicle may be stopped.

According to an aspect of the present disclosure, a semiconductor integrated circuit device includes multiple digital output terminals and multiple output circuits. Multiple digital output terminals are adjacent to each other. Each output circuit includes a switch and applies a potential, which corresponds to either one of binary logic levels, to corresponding one of the digital output terminals through the switch. An indefinite range is interposed between the binary logic levels. The output circuits respectively include potential fixers, and the potential fixers have identical circuit arrangement. Each potential fixer fixes a potential applied to the digital output terminals through the switch to a potential corresponding to either one of the binary logic levels apart from the indefinite range, in response to that a short circuit occurs between the digital output terminals. Therefore, even when a short circuit occurs between digital output terminals, an external circuit receives an input of either one of the binary logic levels and the operation can be continued without having the external circuit in an unstable operation.

The following describes several embodiments of a semiconductor integrated circuit device included in a control system with reference to the drawings. In each of the embodiments described below, the same or similar reference numerals are assigned to the same or similar components that perform the same or similar operations, and a description of the same or similar components will be omitted.

First Embodiment

FIGS. 1 to 5 are illustrative diagrams of a first embodiment. FIG. 1 schematically shows an entire configuration of a control system 2 using an ASIC 1 as a semiconductor integrated circuit device.

The control system 2 includes an ASIC 1 which is used for control of a moving object (for example, vehicle). The control system 2 configures a power supply circuit 4 by providing a peripheral circuit 3 to an outside of an ASIC 1, and outputs a voltage Vo to an internal load 5 and an external load 6 of a main part of the ASIC 1 from a power supply circuit 4. The power supply circuit 4 includes, for example, a linear regulator. The power supply circuit 4 is configured to supply load currents Ioin and Ioex to the internal load 5 and the external load 6, respectively, but any one of those loads (that is, the internal load 5 or the external load 6) may not be provided. The power supply circuit 4 itself may also be provided as necessary.

The ASIC 1 includes multiple terminal 1a to 1h. Apart of the power supply circuit 4 is formed in the ASIC 1, and a peripheral circuit 3 included in the power supply circuit 4 is connected to the outside of the terminals 1a to 1d. All components of the power supply circuit 4 may be configured in the ASIC 1.

The peripheral circuit 3 includes resistors 8 and 9 to which a power supply 7 is supplied by a battery, and a P-channel type MOSFET 10. A supply output of the power supply 7 is connected to a source of the MOSFET 10 through the resistor 8. The resistor 9 is connected between the source and a gate of the MOSFET 10. A drain of the MOSFET 10 serve as a supply point of an output voltage Vo of the power supply circuit 4. The supply point of the output voltage Vo from the power supply circuit 4 is connected to the external load 6. A common connection point between the power supply 7 and the resistor 8 is connected to the terminal 1a. A common connection point between the resistor 8 and the resistor 9 is connected to the terminal 1b. A common connection point between the gate 9 of the MOSFET 10 and the resistor 9 is connected to the terminal 1c. The drain of the MOSFET 10 is connected to the terminal 1d.

The ASIC 1 includes a feedback voltage input unit 11 (or may also be referred to as a feedback voltage input device) and a comparison unit 12 (or may also be referred to as a comparison device) for controlling the power supply circuit 4. The ASIC 1 further includes a load current detector 13, a comparator 14, an overcurrent determiner 15, and a controller 16 as an overcurrent protection unit 17 (or may also be referred to as an overcurrent protection circuit or an overcurrent protector). In the ASIC 1, the terminal 1e is used as a power supply input terminal for inputting the output voltage Vo of the power supply circuit 4, and the terminals 1f and 1g are used as digital output terminals. The terminal 1h is used as a ground terminal and is grounded to the outside.

The ASIC 1 includes multiple output circuits 19 and 20 for respectively outputting signal potentials from the multiple digital output terminals 1f and 1g to an MCU 18 as an external circuit connected to the outside, and further includes logic circuits 21a and 21b for executing various processes. The logic circuit 21a generates a digital signal by a predetermined logic and outputs the generated digital signal to the output circuit 19, and the logic circuit 21b generates a digital signal by a predetermined logic and outputs the generated digital signal to the output circuit 20. In the following description, a configuration having the same function as that of the logic circuits 21a and 21b will be abbreviated as "logic circuit 21" if necessary.

The following describes the operation of the power supply circuit 4. The feedback voltage input unit 11 is connected to the terminal 1d, and an output of the comparison unit 12 is connected to the terminal 1c. The feedback voltage input unit 11 receives a drain voltage of the MOSFET 10 through the terminal 1d by a feedback, and the comparison unit 12 compares the drain voltage with a reference voltage REF to adjust and control a gate application voltage of the MOSFET 10, thereby adjusting and controlling the voltage Vo to be output to the drain of the MOSFET 10.

On the other hand, in order to detect a load current Io of the power supply circuit 4, the load current detector 13 is connected between the upstream terminals 1a and 1b. The load current detector 13 detects the load current Io flowing through the resistor 8 included in the peripheral circuit 3, converts the load current Io into a voltage Voc, and outputs the voltage Voc to a non-inverting input terminal of the comparator 14.

The comparator 14 compares an overcurrent threshold voltage Vref input to an inverting input terminal with the overcurrent threshold voltage Voc, and outputs the threshold voltage Voc to the overcurrent determiner 15. The overcurrent determiner 15 makes a determination of normal if a comparison result of the comparator 14 is "L", and continues processing. Conversely, if the comparison result is "H", the overcurrent determiner 15 determines that a detection value of the load current Io exceeds a predetermined value, and a current flows. When it is determined by the overcurrent determiner 15 that an overcurrent flows, the controller 16 stops the output of the output voltage Vo of the power supply circuit 4.

The drain voltage of the MOSFET 10 is input to the terminal 1e as the output voltage Vo of the power supply circuit 4. A power supply line N1 is connected to the terminal 1e, and the multiple output circuits 19 and 20 and the internal load 5 are connected to the power supply line N1.

The output circuit 19 includes a CMOS inverter circuit 24a in which a source and a drain of a P-channel MOSFET 22a as a switch unit (or may be referred to as a switch) and a drain and a source of an N-channel MOSFET 23a are connected in series between the two power supply lines N1 and N2, and the drains of the MOSFETs 22a and 23a are electrically connected in common at a node N3a of the digital output terminal 1f.

The output circuit 20 includes a CMOS inverter circuit 24b in which a source and a drain of a P-channel MOSFET 22b as a switch unit (or may be referred to as a switch) and a drain and a source of an N-channel MOSFET 23b are connected in series between the two power supply lines N1 and N2, and the drains of the MOSFETs 22b and 23b are electrically connected in common at a node N3b of the digital output terminal 1g.

Buffers 26a and 26b are formed in preceding stages of the CMOS inverter circuits 24a and 24b, respectively. The buffers 26a and 26b respectively include, for example, inverting gates. The logic circuits 21a and 21b generate digital signals by a predetermined logic, and logically output the digital signals to the CMOS inverter circuits 24a and 24b through the buffers 26a and 26b, respectively.

The multiple output circuits 19 and 20 are configured in the same circuit form. Since the multiple output circuits 19 and 20 are configured by the CMOS inverter circuits 24a and 24b, respectively, the multiple output circuits 19 and 20 may widen or broaden the output voltage range and may include a simple circuit.

Resistors 25a and 25b are connected between the drains of the P-channel MOSFETs 22a and 22b and the digital output terminal 1f and 1g, respectively. The resistance values of the resistors 25a and 25b are set to, for example, about several hundred Ω, and are set to values significantly larger than on-resistances RonP and RonN of the MOSFETs 22a, 22b, 23a, and 23b. The resistors 25a and 25b are configured as current limiting units or current limiter for limiting currents flowing out to the digital output terminals 1f and 1g through the P-channel MOSFETs 22a and 22b. The resistors 25a and 25b are disposed in the same circuit form or identical circuit arrangement between the multiple output circuits 19 and 20.

Figure 2:
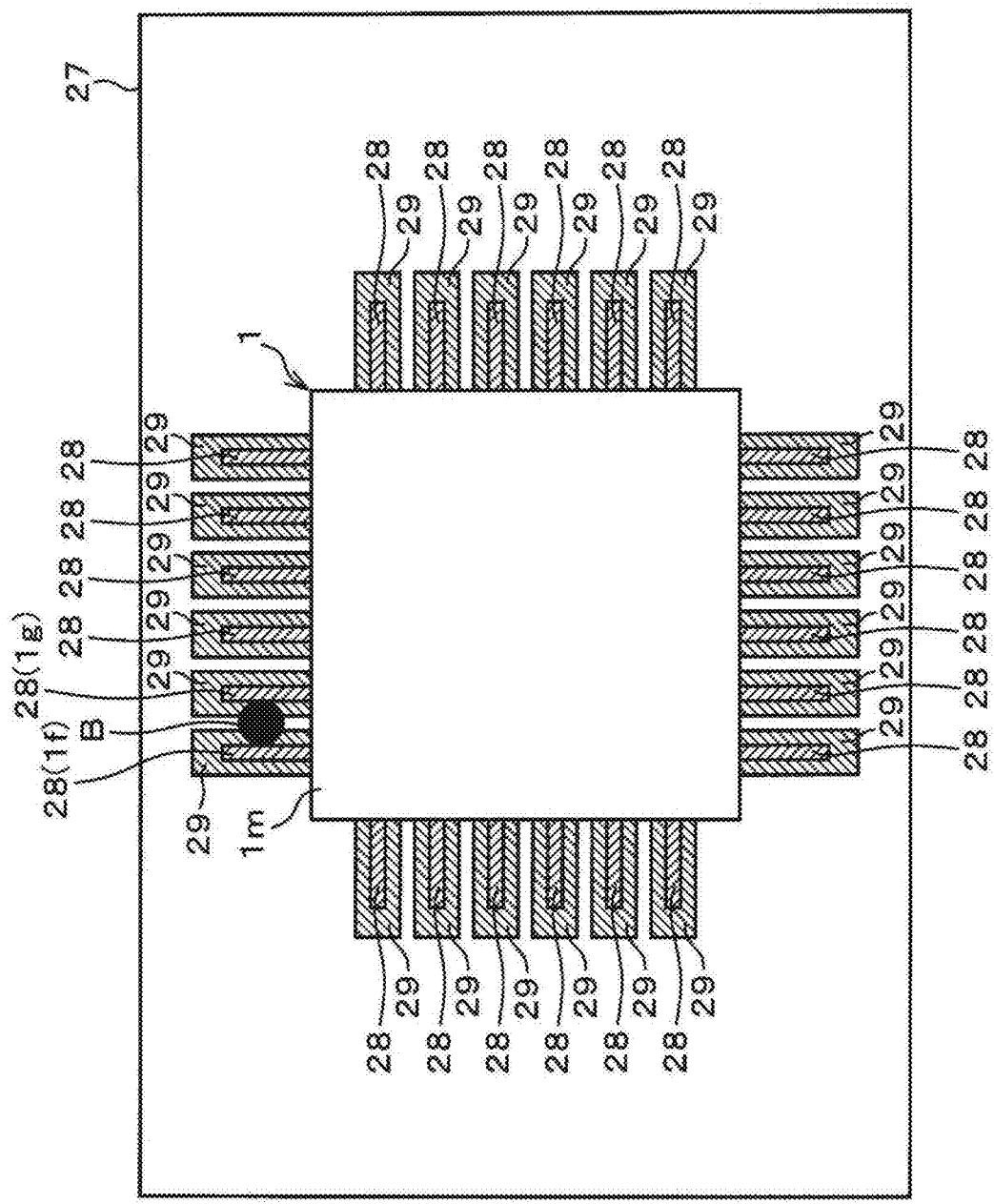
FIG. 2 shows an example of placement of a terminal connection surface and a digital output terminal of a package.
Figure 3:
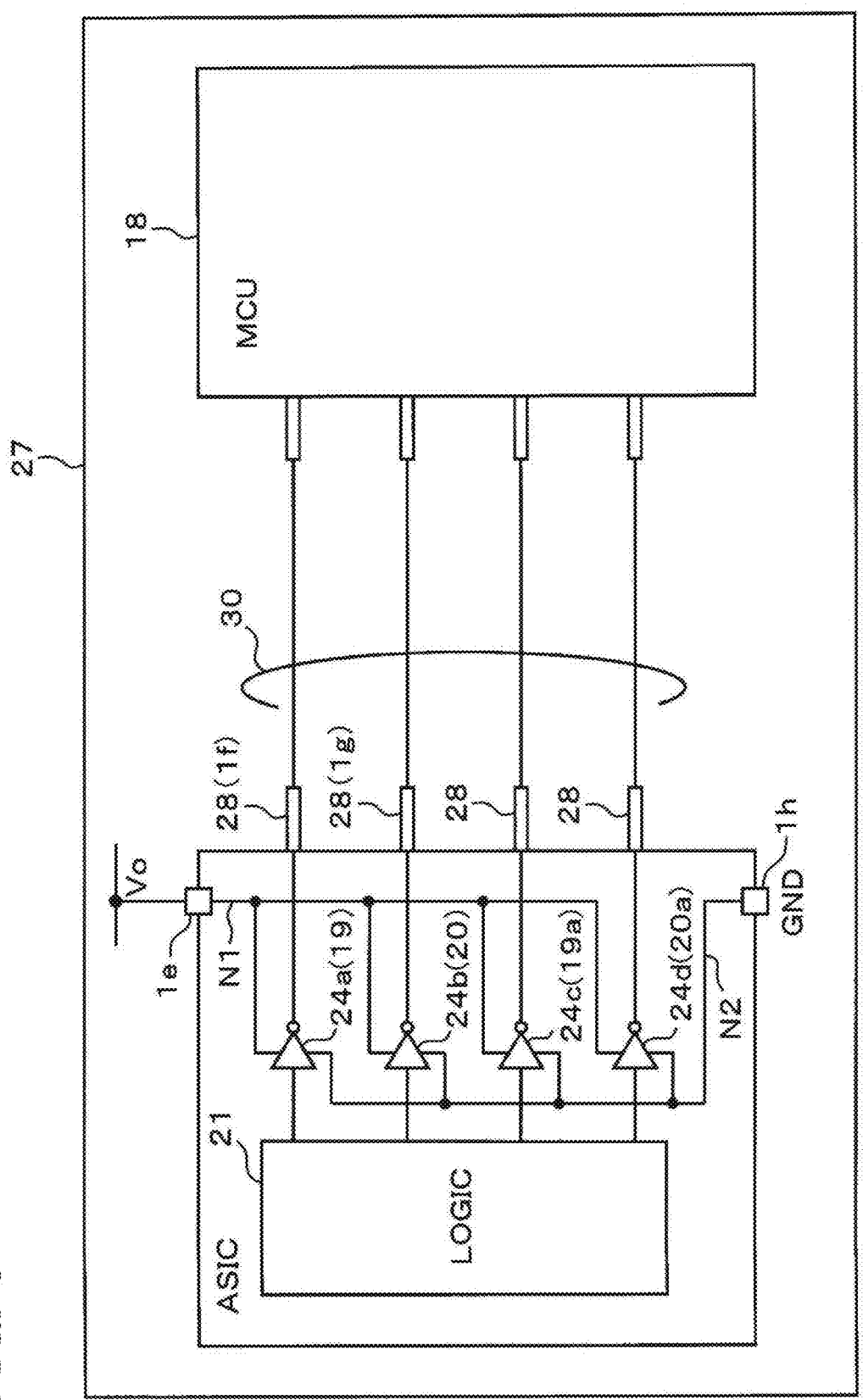
FIG. 3 is a diagram showing an electrical connection relationship between the semiconductor integrated circuit device and an external circuit.

FIG. 2 shows an example of the placement of the digital output terminals 1f and 1g together with a connection surface between lead pins 28 of a package of the ASIC 1 and an in-vehicle control board 27, and FIG. 3 shows an example of an electrical connection between the ASIC 1 and the MCU 18. As shown in FIG. 2, the ASIC 1 is mounted on the in-vehicle control board 27 in a package sealed state according to, for example, the QFP (Quad Flat Package) standard. The ASIC 1 includes an IC mold portion 1*m* configured in a rectangular shape which is a square in plan view, and lead pins 28 extending from a circuit (for example, output circuits 19 and 20) configured inside the IC mold portion as terminals 1*a* to 1*g* (only the digital output terminals 1*f* and 1*g* in FIG. 2).

The ASIC 1 is formed by extending a predetermined number of lead pins 28 outward from each of four sides of the IC mold portion 1*m*. Those lead pins 28 are mounted on lands 29 formed on the in-vehicle control board 27. The lands 29 are electrically connected to other circuits (for example, the MCU 18) and the ground GND (not illustrated).

As shown in FIG. 2, the digital output terminals 1*f* and 1*g* of the multiple output circuits 19 and 20 are disposed adjacent to each other, and soldered to the lands 29 of the in-vehicle control board 27. The multiple digital output terminals 1*f* and 1*g* are disposed adjacent to each other on the same side of the package of the ASIC 1. Although FIG. 2 shows the digital output terminals 1*f* and 1*g* of the output circuits 19 and 20, as shown in FIG. 3, the output circuits 19*a* and 20*a* similar to the output circuits 19 and 20, for example, may be disposed adjacent to each other. In this configuration, the output circuits 19*a* and 20*a* include CMOS inverter circuits 24*c* and 24*d* similar to the CMOS inverter circuits 24*a* and 24*b*, respectively.

As shown in FIG. 3, when the lead pins 28 of the digital output terminals 1*f* and 1*g* are disposed adjacent to each other, the multiple output circuits 19, 20, 19*a*, and 20*a* and further the CMOS inverter circuits 24*a* to 24*d* can also be disposed adjacent to each other and close to each other within the main part of the ASIC 1. As a result, the power supply line N1 of the voltage Vo to be supplied to CMOS inverter circuits 24*a* and 24*b* and the power supply line N2 of the ground GND may be minimized, and the influences of a voltage drop and a potential floating due to wiring resistances may be minimized.

At this time, the internal wirings of the ASIC 1 may be minimized, the influence of electrostatic noises may be reduced, and an EMI tolerance may be improved. In addition, since the digital output terminals 1*f*, 1*g*, and the like between the ASIC 1 and the MCU 18 may be brought together by a parallel lead wire 30, a wiring artwork on the in-vehicle control board 27 may be simplified, and a designing labor of wiring routing may be reduced as much as possible.

As shown in FIG. 1, the gates of the P-channel MOSFETs 22*a* and 22*b* and the gates of the N-channel MOSFETs 23*a* and 23*b* are commonly connected to each other, and the logic circuits 21*a* and 21*b* apply a potential corresponding to the digital level "H" or the digital level "L" to the gates of the MOSFETs 22*a*, 23*a*, 22*a*, and 22*b* through the buffers 26*a* and 26*b*.

When the output circuits 19 and 20 operate normally as usual, no current flows in the CMOS inverter circuits 24*a* and 24*b* except for a through current flowing at the time of switching. When the overcurrent determiner 15 determines that a current obtained by summing a current Ioin flowing through the external load 6 and a current Ioin flowing through the internal load 5 exceeds an overcurrent threshold, the controller 16 of the overcurrent protection unit 17 outputs a gate voltage of the MOSFET 10 as the same voltage as a source voltage to protect the function of the power supply circuit 4 from overcurrent and to prevent a failure of the MOSFET 10 serving as the power supply output element. In that situation, the function may be protected from overcurrent, the entire system may be stopped, and the vehicle may be stopped in an emergency.

FIGS. 4 and 5 show digital input acceptance levels of the MCU 18 which is connected to the outside of the digital output terminals 1*f* and 1*g*. The MCU 18 digitally receives, for example, the CMOS levels shown in FIG. 4 or FIG. 5. For example, as shown in FIG. 4, in the CMOS levels, a potential level range for accepting an input of a "H" level for a voltage of a power supply voltage VDD (=Vo)–the ground GND between two power supply lines N1 and N2 is set to 0.7×VDD to VDD, a potential level range for accepting an input of an "L" level is set to 0.3×VDD to GND, and a range of 0.3×VDD to 0.7×VDD between those ranges is set as an indefinite range.

When a digital input portion of the MCU 18 is formed of a CMOS inverter circuit (not illustrated), a through current between the drain and source of the P-channel MOSFET and the N-channel MOSFET in the CMOS inverter circuit may be considered. In this instance, as shown in FIG. 5, the potential level range for accepting input of the "H" level may be set to VDD–Vt to VDD, and the potential level range for accepting input of the "L" level may be set to Vt to GND. In this example, Vt is a gate-source threshold voltage (for example, 0.7 V) of the MOSFET of the CMOS inverter circuit. As a result, the through current of the CMOS inverter circuit in the digital input unit of the MCU 18 may be prevented.

Since the MCU 18 is capable of receiving the CMOS levels, the multiple output circuits 19 and 20 are generally configured to apply a potential corresponding to one of the "H" and "L" levels sandwiching an indefinite range to the multiple digital output terminals 1*f*, 1*g* through the CMOS inverter circuits 24*a* and 24*b*, respectively.

The resistors 25*a* and 25*b* are connected to the CMOS inverter circuit 24*a* and 24*b*, respectively. The resistance values of the resistors 25*a* and 25*b* are set to, for example, a value of several hundred Ω so that the potential of the digital output terminals 1*f* and 1*g* falls within a potential level range of the "L" level that may be accepted and input by the digital input unit of the MCU 18 even when the adjacent digital output terminals 1*f* and 1*g* are short-circuited. Therefore, the resistors 25*a* and 25*b* function as a potential fixing unit (or may also referred to as a potential fixer) that fixes the potential applied to the digital output terminals 1*f* and 1*g* by the output circuits 19 and 20 to the potential corresponding to the "L" level except for the indefinite range.

The resistance values of those resistors 25*a* and 25*b* may be set so that a sum of a total maximum value of the load currents Ioin and Ioex flowing through the internal load 5 and the external load 6, respectively, and the current limit values flowing through the output circuits 19 and 20 by the resistor 25*a* or 25*b* when the digital output terminals 1*f* and 1*g* adjacent to each other are short-circuited is set to less than a predetermined value which is a threshold of the detection current value of the load current Io protected by the overcurrent protection unit 17. When the setting is made in this manner, even if the short-circuit current Ia (see FIG. 1) is generated between the adjacent digital output terminals 1*f* and 1*g* during actual use, the function of the power supply circuit 4 is not stopped by the fault of the overcurrent protection unit 17, and the function of the power supply circuit 4 may be maintained.

For example, as shown in FIG. 2, when the ASIC 1 is mounted on the in-vehicle control board 27 and then flow soldering is performed, a conductive foreign matter B may remain between the digital output terminals 1*f* and 1*g*. In such a situation, even though the digital output terminals 1*f* and 1*g* are short-circuited through the conductive foreign matter B, and the adjacent output circuits 19 and 20 output the levels different from each other, for example, "H" and "L", respectively, the same potential in the indefinite range is output from the digital output terminals 1*f* and 1*g* to the MCU 18 so that the MCU 18 may operate unsteadily.

In the present embodiment, the resistors 25*a* and 25*b* are connected between the drains of the P-channel MOSFETs 22*a* and 22*b* and the digital output terminals 1*f* and 1*g* in the same circuit form or identical circuit arrangement, respectively. With the configuration described above, even when the multiple digital output terminals 1*f* and 1*g* are short-circuited, the multiple output circuits 19 and 20 may fix the potentials applied to the digital output terminals 1*f* and 1*g* through the P-channel MOSFETs 22*a* and 22*b* to any potential corresponding to the binary logical levels "H" and "L".

For example, it may be assumed that both of the output circuits 19 and 20 output the "H" level. At this time, the output circuit 19 applies the output voltage Vo of the power supply circuit 4 to the digital output terminal 1*f* through the MOSFET 22*a* and the resistor 25*a*. The output circuit 20 applies the output voltage Vo of the power supply circuit 4 to the digital output terminal 1*g* through the MOSFET 22*b* and the resistor 25*b*. When there is a short circuit between those digital output terminals 1*f* and 1*g*, the logical levels of those digital output terminals 1*f* and 1*g* are fixed to the "H" level. Since the digital input unit of the MCU 18 receives the "H" level, the operation of MCU 18 is not unstable.

On the contrary, for example, it may be assumed that both of the output circuits 19 and 20 output the "L" level. At this time, the output circuit 19 applies the ground potential GND to the digital output terminal 1*f* by turning on the MOSFET 23*a*, and applies the ground potential GND to the digital output terminal 1*g* by turning on the MOSFET 23*b* of the output circuit 20. If there is a short circuit between those digital output terminals 1*f* and 1*g*, the levels of those digital output terminals 1*f* and 1*g* are fixed to the "L" level. In this instance, since the digital input unit of the MCU 18 receives the "L" level, the operation of the MCU 18 does not become unstable.

The following describes an operation when the output circuits 19 and 20 output potentials corresponding to mutually opposite binary logic levels "H" and "L".

For example, it may be assumed that the output circuit 19 outputs the "H" level to the digital output terminal 1*f* while the output circuit 20 outputs the "L" level to the digital output terminal 1*g*.

At this time, the logic circuit 21*a* outputs the "L" level to a common gate of the CMOS inverter circuit 24*a* through the buffer 26*a*, whereby the P-channel MOSFET 22*a* of the output circuit 19 is turned on and the N-channel MOSFET 23*a* is turned off. On the other hand, when the logic circuit 21*b* outputs the "H" level to the gate of the CMOS inverter circuit 24*b* through the buffer 26*b*, the P-channel MOSFET 22*b* of the output circuit 20 is turned off and the N-channel MOSFET 23*b* is turned on.

At this time, when the digital output terminals 1*f* and 1*g* are short-circuited by the conductive foreign matter B, as shown in FIG. 1, the short-circuit current Ia flows between the digital output terminals 1*f* and 1*g*, and the short-circuit current Ia flows along a path of the P-channel MOSFET 22*a* of the output circuit 19, the resistor 25*a*, the digital output terminals 1*f* and 1*g*, and the N-channel MOSFET 23*b* of the output circuit 20 (see 1*a* indicated by a dashed line in FIG. 1).

For example, when a common CMOS inverter circuit in which the resistors 25*a* and 25*b* are not provided in the output circuits 19 and 20 is used, a divided potential between the on-resistance RonP of the P-channel MOSFET 22*a* and the on-resistance RonN of the N-channel MOSFET 23*b* is Vo/2(=VDD/2), and therefore, the input potential of the digital input unit of the MCU 18 becomes indefinite even when any of the CMOS input levels shown in FIG. 4 or FIG. 5 is used. The operation of the MCU 18 becomes unstable.

Since the on-resistances RonP and RonN of the MOSFETs 22*a* and 23*b* are, for example, about tens of ohms, the voltage Vo is applied to the terminal 1*e* with the result that the current flowing through the CMOS inverter circuit greatly increases. Then, despite the fact that the current Ioex of the external load 6 and the current Ioin of the internal load 5 fall within a normal current range, the overcurrent determiner 15 determines the overcurrent flows through the CMOS inverter circuit, and accordingly the overcurrent determiner 15 determines that the load current Io is the overcurrent. As result, the controller 16 stops the operation of the power supply circuit 4 for stopping the entire system and causing the vehicle to be stopped urgently.

In the present embodiment, in order to prevent the above situation, the resistor 25*a* is connected between the P-channel MOSFET 22*a* and the digital output terminal 1*f*. Even if the adjacent digital output terminals 1*f* and 1*g* are short-circuited, the divided potential of the total resistance value of the on-resistance RonP and the resistor 25*a* and the resistance value of the on-resistance RonN is output as a fixed potential to the digital output terminals 1*f* and 1*g*. Since the resistance value of the resistor 25*a* is set to the potential level range of the "L" level that may be accepted and input by the digital input unit of the MCU 18, the MCU 18 may be prevented from becoming unstable by inputting the "L" level to the digital input unit of the MCU 18.

Further, since the resistance value of the resistor 25*a* is set to, for example, about several hundred Ω, which is much larger than the on-resistances RonP and RonN of the respective MOSFETs 22*a* and 23*b*, for example, even if the short-circuit current Ia flows between the multiple digital output terminals 1*f* and 1*g*, an absolute value of the short-circuit current Ia between the digital output terminals 1*f* and 1*g* may be greatly inhibited, the overcurrent determiner 15 does not determine the overcurrent, and the power supply circuit 4 may continue to output the voltage Vo. This makes it possible to avoid an emergency stop of the vehicle.

When the output circuit 19 outputs the "L" level to the digital output terminal 1*f* and the output circuit 20 outputs the "H" level to the digital output terminal 1*g*, the digital output terminals 1*f* and 1*g* is short-circuited.

Even in such a case, since the multiple output circuits 19 and 20 are configured in the same circuit form or identical circuit arrangement, the above-mentioned symmetrical operation in which the multiple output circuits 19 and 20 are interchanged is performed. Similarly to the case in which the output circuit 19 outputs the "H" level to the digital output terminal 1*f* and the output circuit 20 outputs the "L" level to the digital output terminal 1*g*, the digital input unit of the MCU 18 receives the "L" level, and the MCU 18 may be avoided from becoming unstable. Further, the overcurrent determiner 15 does not determine the overcurrent, and the power supply circuit 4 continues to output the voltage Vo. As a result, it is not likely that emergency stop of the vehicle occurs.

According to the present embodiment, the multiple output circuits 19 and 20 have the potential fixing units (resistors 25a and 25b) in the same circuit form or identical circuit arrangement so as to fix the potential applied to the digital output terminals 1f and 1g through the MOSFETs 22a and 22b to the potential corresponding to the "L" level when the multiple digital output terminals 1f and 1g are short-circuited. It is possible to prevent the MCU 18 from becoming unstable, and to continue the operation without falling into a system failure by inputting the "L" level to the MCU 18 at a fixed level. For example, when the MCU 18 receives the "L" level for a predetermined period or longer, the MCU 18 may recognize that the fixed level as an abnormal signal, and the MCU 18 may execute a fail-safe process of the system as required.

In addition, the multiple digital output terminals 1f and 1g may be disposed adjacent to each other, and the degree of freedom of terminal placement of the ASIC 1 may be improved.

Even if the digital output terminals 1f and 1g are short-circuited and the short-circuit current Ia flows between the digital output terminals 1f and 1g, the current Ia flows through the resistor 25a, so that the overcurrent determiner 15 does not determine the overcurrent and the power supply circuit 4 does not stop the power supply. In other words, since the overcurrent determiner 15 does not detect as overcurrent the current flowing through the output circuits 19 and 20, the main part itself of the ASIC 1 may continue to operate. Therefore, the power supply circuit 4 may stably supply a power to other loads to which the power is supplied (for example, the internal load 5 and the external load 6), to avoid a vehicle emergency stop state in which the entire system stops. Since the current limiting unit includes the resistor 25a, the current may be limited by use of a simple circuit configuration.

The ASIC 1 is mounted on the in-vehicle control board 27. Although the controller 16 of the overcurrent protection unit 17 is configured to stop the function of the power supply circuit 4 when the load current Io exceeds a predetermined value of the overcurrent, even if the short-circuit current Ia occurs between the adjacent terminals 1f and 1g while the vehicle is traveling, the short-circuit current Ia flowing between the terminals 1f and 1g does not affect the overcurrent determination by the overcurrent determiner 15, and the power supply circuit 4 may continue to supply the current to the internal load 5 and the external load 6.

If the overcurrent protection unit 17 stops the function of the power supply circuit 4 because the total current value of the load currents Ioex and Ioin of the external load 6 and the internal load 5 exceeds the predetermined value of the overcurrent, the power supply output function of the power supply circuit 4 may be stopped without affecting the operation of the MCU 18 which receives the signals of the digital output terminals 1f and 1g.

Second Embodiment

Figure 6:
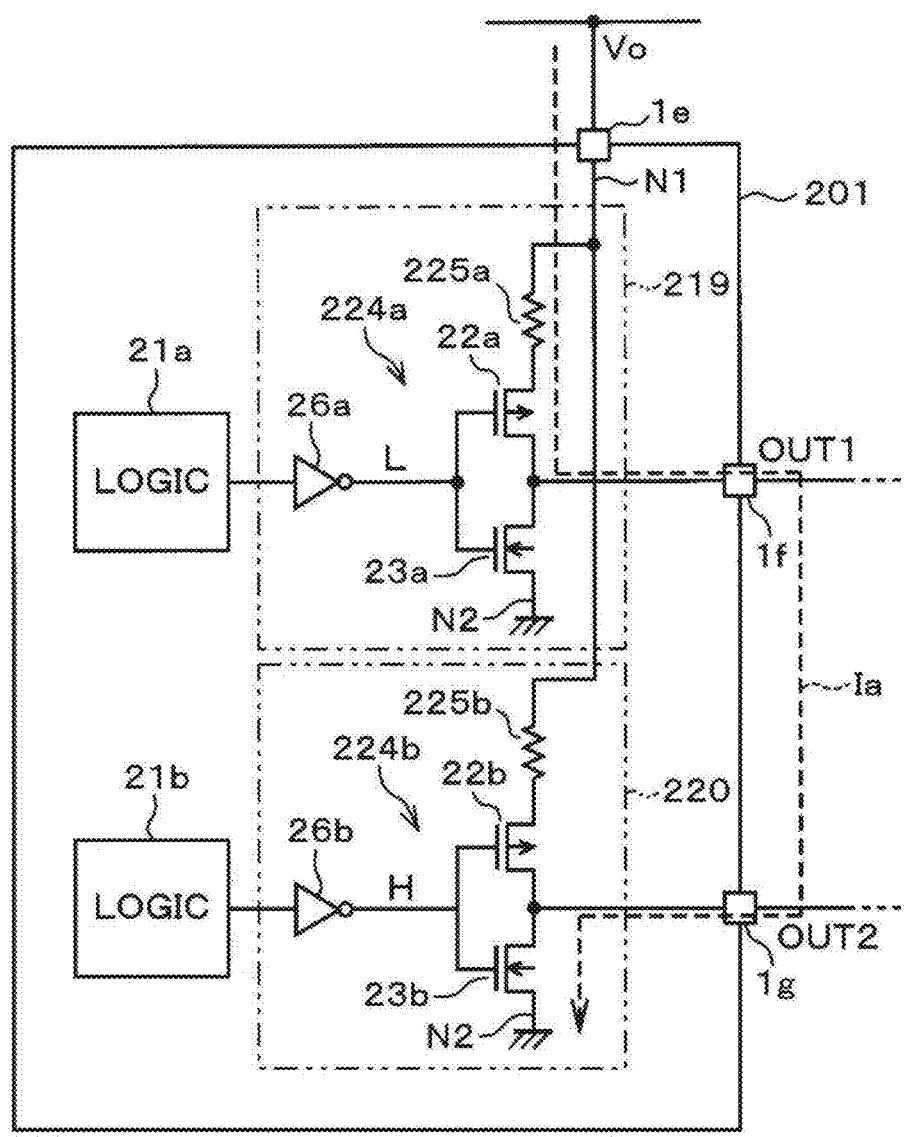
FIG. 6 is an electric configuration diagram of multiple output circuits according to a second embodiment.

FIG. 6 shows an additional illustrative diagram of a second embodiment. FIG. 6 shows another exemplary configuration of multiple output circuits 219 and 220 of an ASIC 201. The ASIC 201 is the same as the configuration of the ASIC 1 of the first embodiment except for the configuration of output circuits 219 and 220, and therefore an illustration of the same configuration will be omitted. In addition, since the configuration of a power supply circuit 4 including a peripheral circuit 3 is the same, a description of the configuration will be omitted together with the illustration.

The output circuit 219 includes a buffer 26a, a CMOS inverter circuit 224a, and a resistor 225a. The output circuit 220 includes a buffer 26b, a CMOS inverter circuit 224b, and a resistor 225b. The CMOS inverter circuit 224a includes a P-channel MOSFET 22a and an N-channel MOSFET 23a, and the P-channel MOSFET 22a and the N-channel MOSFET 23a have gates commonly connected to each other and drains commonly connected to each other.

The CMOS inverter circuit 224b includes a P-channel MOSFET 22b and an N-channel MOSFET 23b, and the P-channel MOSFET 22b and the N-channel MOSFET 23b have gates commonly connected to each other and drains commonly connected to each other.

The resistor 225a of the output circuit 219 is connected between one power supply line N1 to which a voltage Vo is supplied and a source of the P-channel MOSFET 22a of the CMOS inverter circuit 224a. The resistor 225b of the output circuit 220 is connected between one power supply line N1 to which the voltage Vo is supplied and a source of the P-channel MOSFET 22b of the CMOS inverter circuit 224b. The multiple output circuits 219 and 220 and the resistors 225a and 225b are configured in the same circuit form or identical circuit arrangement.

For example, it is considered that the output voltage Vo of the power supply circuit 4 for outputting an "H" level by the output circuit 219 is applied to a digital output terminal 1f through the resistor 225a and the MOSFET 22a, the ground potential GND for outputting an "L" level by the adjacent output circuit 220 is applied to a digital output terminal 1g, and the digital output terminals 1f and 1g are short-circuited by a conductive foreign matter B. In this instance, as shown in FIG. 6, a short-circuit current Ia flows through a path of the resistor 225a of the output circuit 219, the P-channel MOSFET 22a, the digital output terminals 1f and 1g, and the N-channel MOSFET 23b of the output circuit 220 from the terminal 1e to which the voltage Vo is applied. The resistor 225a may limit the short-circuit current Ia, and the same operation and effects as those of the embodiment described above may be obtained.

Further, since the resistor 225a is connected between the power supply line N1 serving as the supply node of the voltage Vo and the source of the P-channel MOSFET 22a, the resistor 225a performs a constant current operation, and the voltage Vo hardly fluctuates.

In the configuration shown in FIG. 6, although the resistors 225a and 225b are connected between the power supply line N1 and the respective sources of the P-channel MOSFETs 22a and 22b, respectively, the present disclosure is not limited to the above configuration, and for example, the present disclosure may be applied to a configuration in which the resistors 225a and 225b are connected between the power supply line N2 serving as the ground GND and the respective sources of the N-channel MOSFETs 23a and 23b as current limiting units. In this situation, the same operation and effects are obtained.

Third Embodiment

Figure 7:
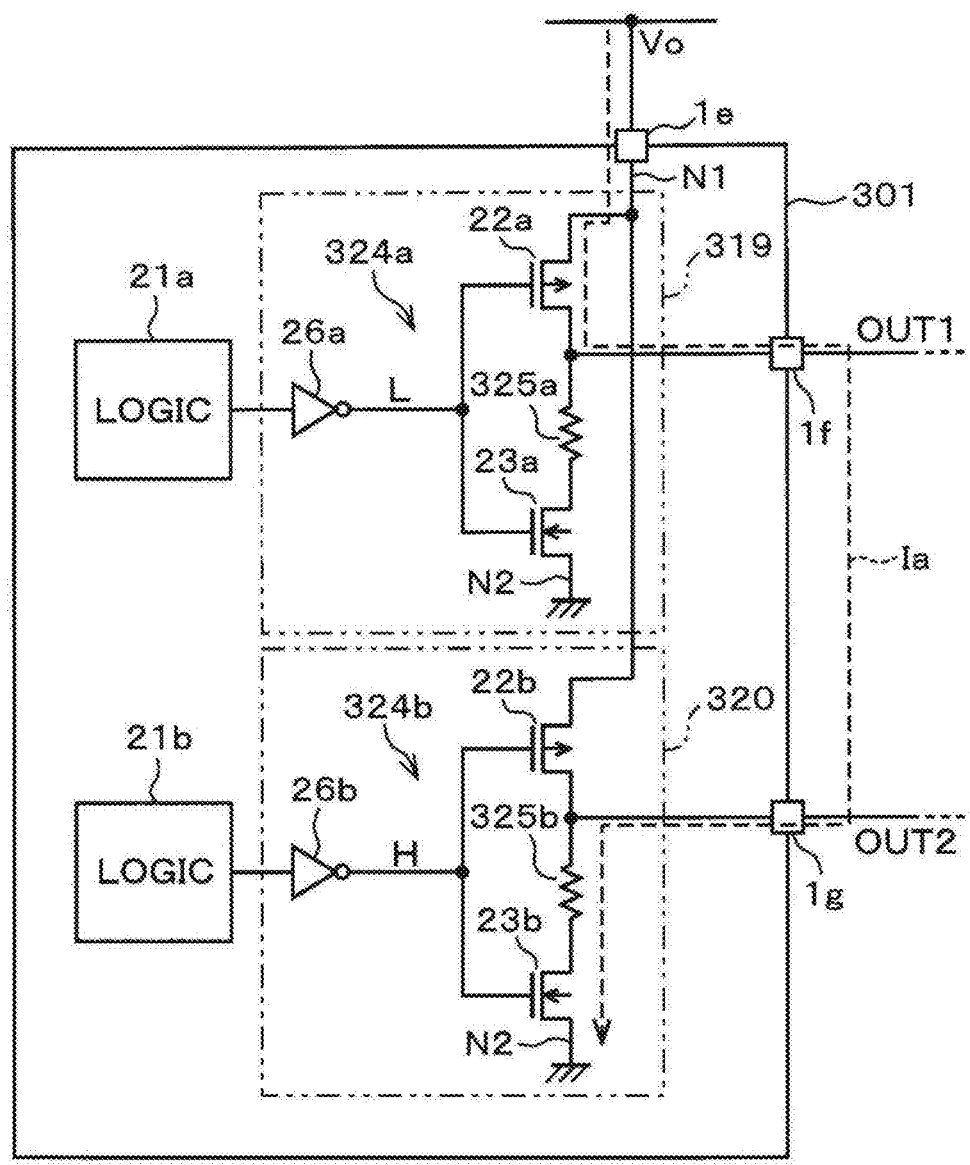
FIG. 7 is an electric configuration diagram of multiple output circuits according to a third embodiment.

FIG. 7 shows an additional illustrative diagram of a third embodiment. FIG. 7 shows another exemplary configuration of multiple output circuits 319 and 320 included in an ASIC 301. The ASIC 301 is the same as the configuration of the ASIC 1 of the first embodiment except for the configuration of the output circuits 319 and 320, and an illustration of the same configuration will be omitted. Since a configuration of a power supply circuit 4 including a peripheral circuit 3 is also the same as that in the first embodiment, a description of the configuration will be omitted together with the illustration.

The output circuit 319 includes use of a CMOS inverter circuit 324a in which a P-channel MOSFET 22a and an N-channel MOSFET 23a as switch units are electrically commonly connected to each other between two power supply lines N1 and N2 at a node N3a of an output terminal. The output circuit 320 includes a CMOS inverter circuit 324b in which a P-channel MOSFET 22b and an N-channel MOSFET 23b as switch units are electrically commonly connected to each other between the two power supply lines N1 and N2 at a node N3b of the output terminal.

The output circuits 319 and 320 are configured in the same circuit form or identical circuit arrangement. A resistor 325a is connected between a drain of the N-channel MOSFET 23a and a digital output terminal 1f. A resistance value of the resistor 325a is set to, for example, about several hundred ohms, and is set to a value significantly larger than on-resistances RonP and RonN of the MOSFETs 22a, 23a, 22b, and 23b. The resistor 325a is configured as a current limiting unit that limits a current flowing into the digital output terminal 1f through the N-channel MOSFET 22b.

A resistor 325b is connected between a drain of the N-channel MOSFET 23b and a digital output terminal 1g. A resistance value of the resistor 325b is set to, for example, about several hundred Ω, and is set to a value significantly larger than the on-resistances RonP and RonN of the MOSFET 22a, 23a, 22b, and 23b. The resistor 325b is configured as a current limiting unit that limits a current flowing into the digital output terminal 1g through the N-channel MOSFET 22a. The resistors 325a and 325b are disposed in the same circuit form or identical circuit arrangement between the multiple output circuits 319 and 320.

The resistance values of the resistors 325a and 325b are set so that the potentials of the digital output terminals 1f and 1g fall within a potential level range that may be accepted as an "H" level by a digital input unit of the MCU 18 even when the adjacent digital output terminals 1f are 1g are short-circuited. Therefore, the resistors 325a and 325b are configured as potential fixing units that fix the potentials applied to the digital output terminals 1f and 1g by the output circuits 319 and 320 to a potential corresponding to an "H" level except for an indefinite range.

Further, the resistance values of those resistors 325a and 325b may be set so that a sum of a total maximum value of load currents Ioin and Ioex flowing through an internal load 5 and an external load 6, respectively, and the current limit values by the resistors 325a and 325b when the digital output terminals 1f and 1g are short-circuited is set to less than a predetermined value which is a threshold of a detection current value of a load current Io protected by an overcurrent protection unit 17. When the setting is made in this manner, even if the short-circuit current Ia flows between the adjacent digital output terminals 1f and 1g during actual use, the operation of the power supply circuit 4 is not stopped by the protection function of the overcurrent protection unit 17, and the power supply circuit 4 may continue to output the power.

For example, it is considered that the output voltage Vo of the power supply circuit 4 for outputting an "H" level by the output circuit 319 is applied to a digital output terminal 1e through the MOSFET 22a, the ground GND for outputting an "L" level by the neighboring output circuit 320 is applied to a digital output terminal 1g, and at this time, the digital output terminals 1f and 1g are short-circuited by a conductive foreign matter B.

In this situation, the logic circuit 21a outputs the "L" level to a gate of the CMOS inverter circuit 324a through the buffer 26a, whereby the P-channel MOSFET 22a of the output circuit 319 is turned on and the N-channel MOSFET 23a is turned off. When the logic circuit 21g outputs the "H" level to the gate of the CMOS inverter circuit 324b through the buffer 26b, the P-channel MOSFET 22b of the output circuit 320 is turned off and the N-channel MOSFET 23b is turned on. At this time, when the digital output terminals 1f and 1g are short-circuited, the short-circuit current Ia flows between the digital output terminals 1f and 1g, and the short-circuit currents Ia flows along a path of the P-channel MOSFET 22a of the output circuit 319, the digital output terminals 1f and 1g, the resistance 325b of the output circuit 320, and the N-channel MOSFET 23b (see 1a indicated by a dashed line in FIG. 7).

In the present embodiment, since the resistor 325b is connected between the N-channel MOSFET 23b and the digital output terminal 1g, even if the adjacent digital output terminals 1f and 1g is short-circuited, a divided potential of the ON resistance RonP of the MOSFET 22a and the resistance value of the resistor 325b and the ON-resistance RonN of the MOSFET 23b is output as a fixed potential to the digital output terminals 1f and 1g. Since the resistance value of the resistor 325b is set to the potential level range of the "H" level that may be accepted and input by the digital input unit of the MCU 18, the MCU 18 may be prevented from becoming unstable by inputting the "H" level to the digital input unit of the MCU 18.

Further, since the resistance value of the resistor 325b is set to be larger than, for example, the on-resistances RonP and RonN of the respective MOSFETs 22a, 23a, 22b, and 23b, even if the short-circuit current Ia flows between the multiple digital output terminals 1f and 1g, the value of the short-circuit current Ia between the digital output terminals 1f and 1g may be inhibited, so that the overcurrent determiner 15 does not determine the overcurrent to stop the power output of the power supply circuit 4, thereby being capable of preventing the entire system from being stopped, and capable of preventing the entire system from falling into an urgent stop state of the vehicle.

In addition, even when the output circuit 319 applies the potential of the ground GND for outputting the "L" level to the digital output terminal 1f and applies the output voltage Vo of the power supply circuit 4 to the digital output terminal 1g through the MOSFET 22b in order that the adjacent output circuit 320 outputs the "H" level, the same operation and effects as those described above are obtained even when the digital output terminals 1f and 1g are short-circuited, and a description of those effects will be omitted.

The multiple output circuits 319 and 320 include, as the potential fixing units, resistors 325a and 325b that fix the potential applied to the digital output terminals 1f and 1g through MOSFET 22a to the potential corresponding to the "H" level when the multiple digital output terminals 1f and 1g are short-circuited. The resistors 325a and 325b are provided in the same circuit form or identical circuit arrangement. The operation of the MCU 18 may be prevented from becoming unstable. In addition, when the MCU 18 receives the "H" level, for example, for a predetermined period or longer, the MCU 18 may recognize that the fixed level as an abnormal signal, and the MCU 18 may execute a fail-safe process of the system as required. Otherwise, the same operation and effects as those of the embodiments described above, particularly, the first embodiment are obtained.

Fourth Embodiment

Figure 8:
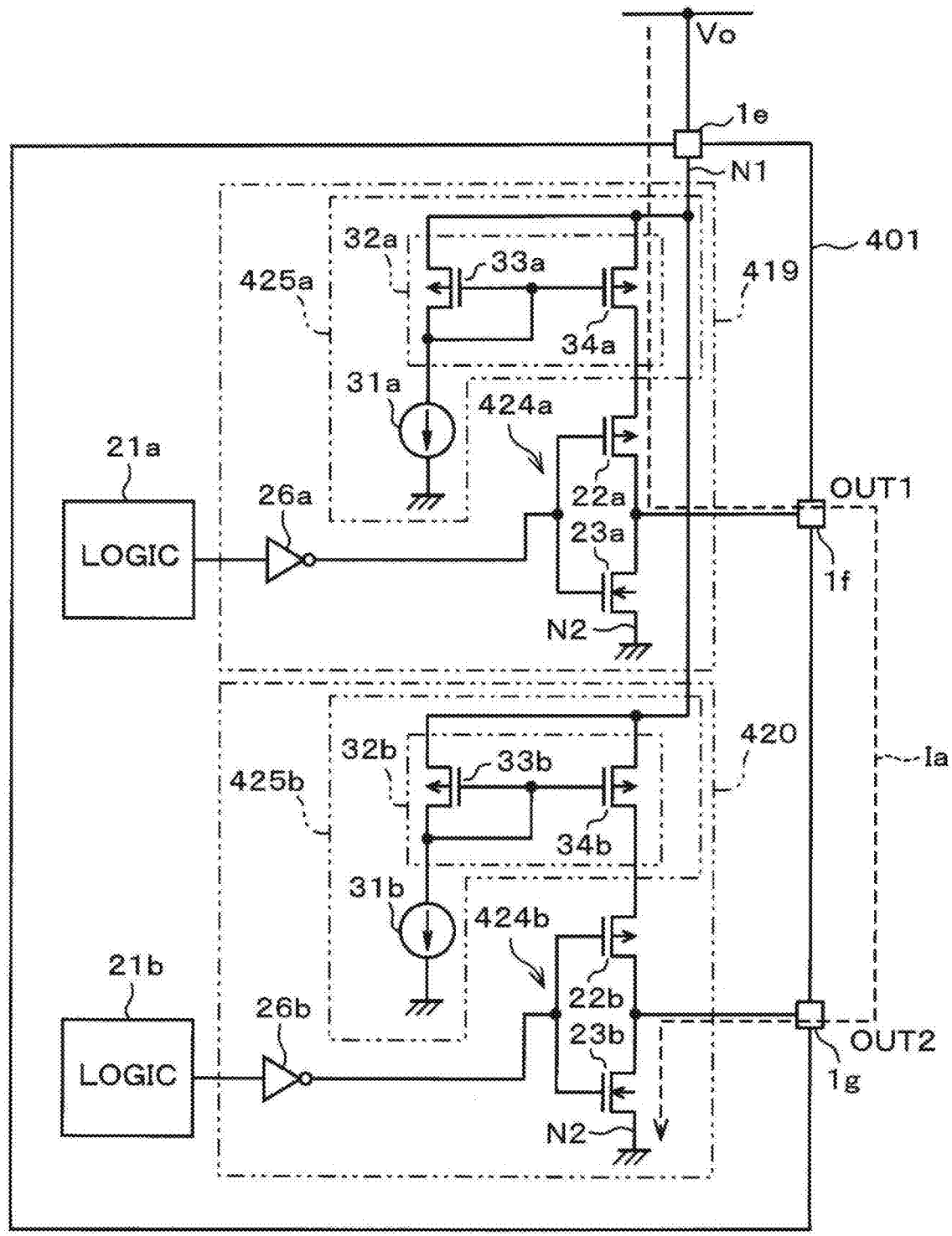
FIG. 8 is an electric configuration diagram of multiple output circuits according to a fourth embodiment.

FIG. 8 shows an additional illustrative diagram of a fourth embodiment. FIG. 8 shows another exemplary configuration of multiple output circuits 419 and 420 included in an ASIC 401. The ASIC 401 is the same as the configuration of the ASIC 1 of the first embodiment except for the configuration of output circuits 419 and 420, and therefore an illustration of the same configuration will be omitted. Since a configuration of a power supply circuit 4 including a peripheral circuit 3 is also the same as that in the first embodiment, a description of the configuration will be omitted together with the illustration.

The output circuit 419 includes a CMOS inverter circuit 424a and a constant current circuit 425a. The output circuit 420 includes a CMOS inverter circuit 424b and a constant current circuit 425b. A constant current circuit 425a is formed between a drain of a P-channel MOSFET 22a of the CMOS inverter circuit 424a and a power supply line N1. A constant current circuit 425b is formed between a drain of a P-channel MOSFET 22b of the CMOS inverter circuit 424b and the power supply line N1.

The constant current circuit 425a includes a constant current source 31a and a current mirror circuit 32a that outputs a mirror current of a constant current by the constant current source 31a to the CMOS inverter circuit 424a, and is configured to apply the constant current to the CMOS inverter circuit 424a. The current mirror circuit 32a includes a P-channel MOSFET 33a having a gate-drain commonly connected to the constant current source 31a and a source connected to the power supply line N1, and a P-channel MOSFET 34a having a gate commonly connected to the gate of the P-channel MOSFET 33a and a source connected to the power supply line N1 and a drain connected to the P-channel MOSFET 22a.

The constant current circuit 425b includes a constant current source 31b and a current mirror circuit 32b that outputs a mirror current of the constant current by the constant current source 31b to the CMOS inverter circuit 424b, and is configured to apply the constant current to the CMOS inverter circuit 424b. The current mirror circuit 32b includes a P-channel MOSFET 33b having a gate-drain commonly connected to the constant current source 31b and a source connected to the power supply line N1, and a P-channel MOSFET 34b having a gate commonly connected to the gate of the P-channel MOSFET 33b and a source connected to the power supply line N1 and a drain connected to the P-channel MOSFET 22b.

The current mirror circuits 32a and 32b may output the mirror currents corresponding to the constant current values of the constant current sources 31a and 31b to the CMOS inverter circuits 424a and 424b, respectively. Therefore, it is possible to improve the accuracy of the output current values to the digital output terminals 1f and 1g. In addition, with the provision of the current mirror circuits 32a and 32b, the H/L level potential of the digital output terminals 1f and 1g is hardly changed by the load current Io. As a result, the constant current circuits 425a and 425b may function as potential fixing units of the digital output terminals 1f and 1g.

For example, it is considered that the output voltage Vo of the power supply circuit 4 for outputting an "H" level by the output circuit 419 is applied to a digital output terminal 1f through the constant current circuit 425a and the MOSFET 22a, the potential of the ground GND for outputting an "L" level by the adjacent output circuit 420 is applied to a digital output terminal 1g, and at this time, the digital output terminals 1f and 1g are short-circuited by a conductive foreign matter B. In that situation, as shown in FIG. 8, the short-circuit current Ia flows along a path of the MOSFET 34a of the current mirror circuit 32a, the P-channel MOSFET 22a of the output circuit 419, the digital output terminals 1f and 1g, and the N-channel MOSFET 23b of the output circuit 420. An upper limit value of the short-circuit current Ia may be limited to the output current of the current mirror circuit 32a. In that situation, the same operation and effects as those of the embodiments described above are obtained.

For example, even when the output circuit 419 applies the potential of the ground GND for outputting the "L" level to the digital output terminal 1f and applies the output voltage Vo of the power supply circuit 4 for causing the adjacent output circuit 420 to output the "H" level to the digital output terminal 1g through the MOSFET 22b, and the digital output terminals 1f and 1g are short-circuited by the conductive foreign matter B, the same operation and effects as those described above are obtained, and a description of those effects will be omitted.

Fifth Embodiment

Figure 9:
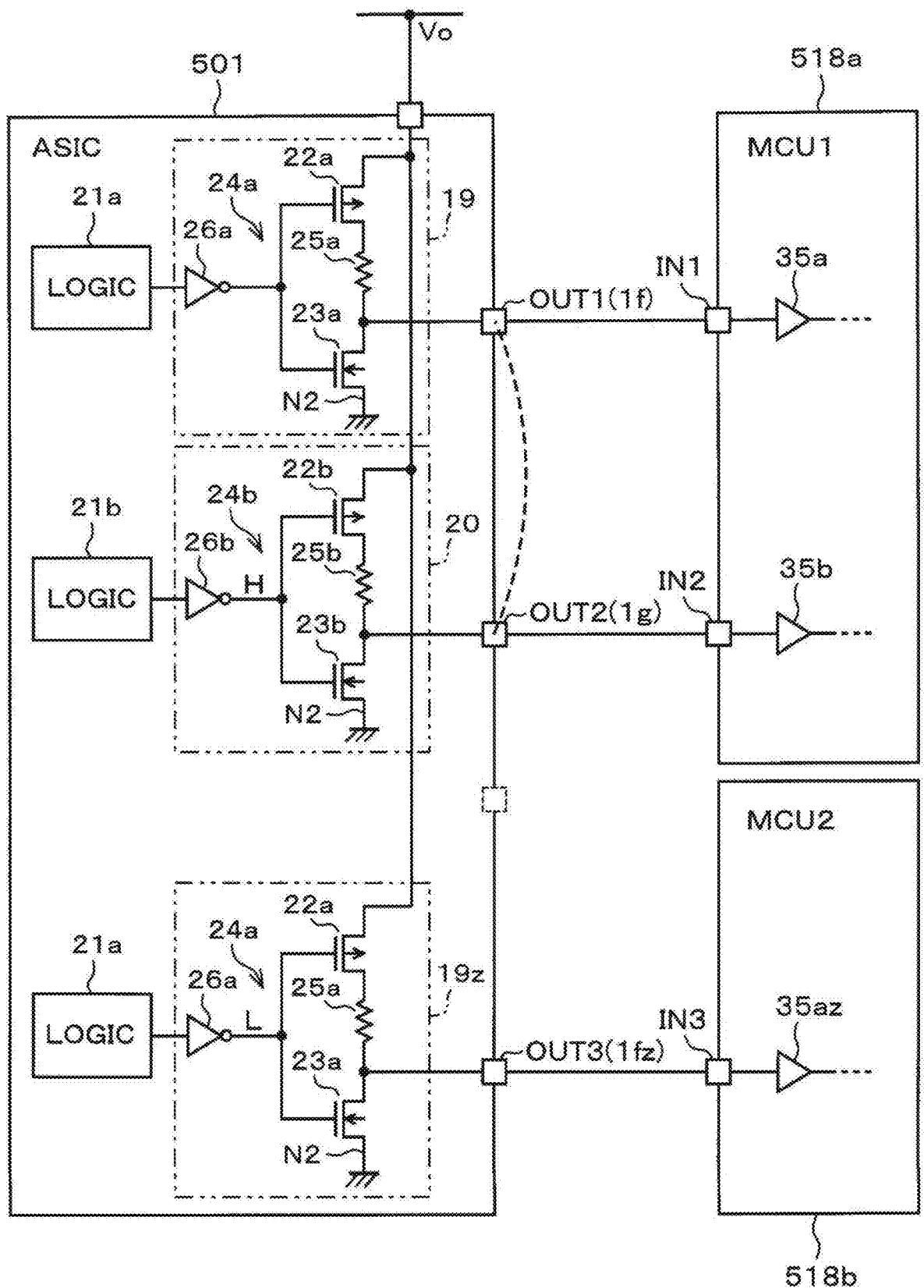
FIG. 9 is a diagram showing an electrical connection relationship between a semiconductor integrated circuit device and an external circuit according to a fifth embodiment.

FIG. 9 shows an additional illustrative diagram of a fifth embodiment. FIG. 9 shows an example of a connection between an ASIC 501 and an MCU 18. Since multiple output circuits 19 and 20 according to the present embodiment are the same as the output circuits 19 and 20 shown in the first embodiment, a description of those components will be omitted. For the simplicity of description, the ASIC 501 shown in FIG. 9 includes digital output terminals 1f, 1g and 1fz of three systems as output terminals OUT1, OUT2, and OUT3, respectively, and the output circuit 19z includes a circuit similar to the output circuit 19, and outputs potentials corresponding to binary logical levels from the digital output terminal OUT3.

As shown in FIG. 9, for example, an MCU 518a as a system uses an input terminal IN1 as an input port for digital signals, and connects the input terminal IN1 to a digital input unit 35a. The MCU 518a uses an input terminal IN2 as a system reset terminal, and connects the input terminal IN2 to a digital input unit 35b. The MCU 518a is configured to operate normally when an "H" level is input to the input terminal IN2 and to reset the system when an "L" level is input to the input terminal IN2. Another MCU 518b similarly uses an input terminal IN3 as a system reset terminal, and connects the input terminal IN3 to a digital input unit 35az. The MCU 518b is configured to operate normally when an "H" level is input to the input terminal IN3 and to reset the system when an "L" level is input to the input terminal IN2.

The ASIC 501 has multiple digital output terminals OUT1, OUT2 . . . OUT3, but lead pins 28 of the output terminals OUT1 and OUT2 are adjacent to each other, but the output terminal OUT3 are not adjacent to the output terminals OUT1 and OUT2.

The digital output terminals OUT1 and OUT2 of the ASIC 501 are connected to the digital input terminals IN1 and IN2 of the MCU 18, respectively, and the digital output terminal OUT3 of the ASIC 501 is connected to the digital input terminal IN3 of the MCU 518b.

At this time, for example, when the output terminals OUT1 and OUT2 are short-circuited as indicated by a dashed line in FIG. 9, the output circuit 19 outputs a potential corresponding to the "L" level to the output terminal OUT1 by the action of a resistor 25a as described in the first embodiment. At this time, the output terminal OUT2 also outputs a potential corresponding to the "L" level. The MCU 518*a* resets the system upon receiving the "L" level. In other words, since the "L" level is predetermined as the system reset input, the MCU 518*a* operates to reset the system when the output terminals OUT1 and OUT2 are short-circuited.

However, in another MPU 518*b*, even if the output of the output terminal OUT3 of the ASIC 501 is input to the input terminal IN3, the short-circuit described above is not affected. The MPU 518*b* normally operates without resetting the system. Since the MCU 518*b* may control the entire system, the MCU 518*b* may perform a fail-safe process related to a vehicle control.

According to the present embodiment, since the resistors 25*a* and 25*b* are fixed to the potential corresponding to the "L" level for instructing the system of the MCU 518*a* to which the digital output terminal OUT2 is connected to be stopped when the digital output terminals OUT1 and OUT2 are short-circuited, the MCU 518*a* may reset the system. Since the other MCU 518*b* may continue the normal operation, the MCU 518*b* may continue the normal operation to execute the fail-safe process related to the vehicle control.

Sixth Embodiment

Figure 10:
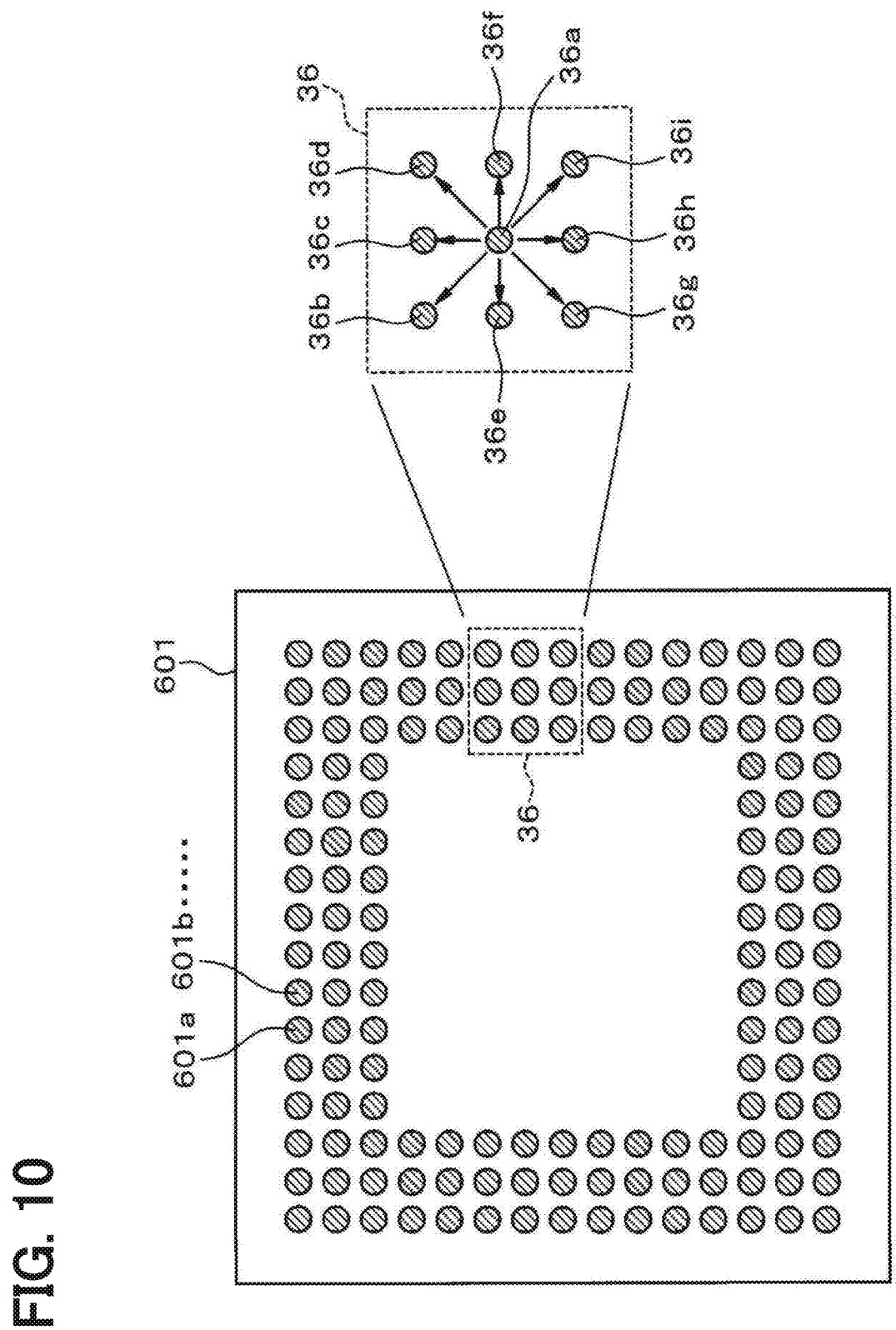
FIG. 10 shows an example of placement of a terminal connection surface and a digital output terminal of a package according to a sixth embodiment.

FIG. 10 shows an additional illustrative diagram of a sixth embodiment. Although FIG. 2 described in the first embodiment shows a package using the QFP, other packages may be applied. As shown in FIG. 10, a package based on the specifications of a BGA (Ball Grid Array) may be used.

As shown in FIG. 10, terminals 601*a*, 601*b*, . . . are arrayed on a terminal surface of the package of an ASIC 601 in a predetermined array in accordance with the specifications of the BGA. In the above array, attention is paid to a terminal group 36 in which terminals are arrayed at lattice points of three rows and three columns at a predetermined pitch.

If the package of the ASIC 601 is mounted on a mounting surface of an in-vehicle control board 27 and then flow-soldered, a conductive foreign matter B may remain on a terminal group 36. Then, it may be assumed that a part of the terminal groups 36 is short-circuited, and that a terminal 36*a* at the center of the lattice points of three rows and three columns is short-circuited to the terminals 36*b* to 36*i* which are vertically and horizontally obliquely adjacent to each other.

For example, when the terminals 36*a* to 36*i* of the terminal group 36 located at the lattice points of three rows and three columns are digital output terminals such as a output circuit 19, even if the output terminals 36*a* to 36*i* are all short-circuited, the output potentials of all the output terminals 36*a* to 36*i* may be fixed to the potential corresponding to the "L" level or the "H" level, and the external MCU 18 may receive those outputs as the "L" level or the "H" level.

Even if those terminal groups 36 are all short-circuited, the MCU 18 may continue to operate without invalidating an abnormal logic. In addition, the present disclosure is not limited to the QFP and the BGA, and any package of, for example, an SOP (Small Outline Package) and a WLP (Wafer Level Package) may be used. In other words, even if a package having relatively many input and output terminals 1*s* employed, the functions of the terminals may be pin-assigned without considering restrictions, as a result of which the external MCU 18 may stably continue operation without falling into an unstable operation.

Other Embodiments

The present disclosure may not be limited to the embodiments described above, but may also be implemented by various modifications, and may be applied to various embodiments without departing from a spirit of the present disclosure. For example, the following modifications or extensions may be performed. In addition, various combinations and configurations, as well as other combinations and configurations that include only one element, more, or less, are within the scope and spirit of the present disclosure.

Various semiconductor integrated circuit devices may be used in place of the ASICs 1, 201, 301, 401, 501, and 601. The devices and/or functions provided by the semiconductor integrated circuit device may be provided by software recorded in a tangible memory device and a computer executing the software, hardware, or a combination of the software, the computer, and the hardware.

What is claimed is:

1. A semiconductor integrated circuit device comprising:
a plurality of digital output terminals being adjacent to each other; and
a plurality of output circuits, each output circuit including a switch and configured to apply a potential, which corresponds to either one of binary logic levels, to the digital output terminals through the switch,
wherein an indefinite range is interposed between the binary logic levels,
wherein the output circuits respectively include potential fixers,
wherein the potential fixers have identical circuit arrangement, and each potential fixer is configured to fix a potential applied to corresponding one of the digital output terminals through the switch to a potential corresponding to either one of the binary logic levels apart from the indefinite range, in response to that a short circuit occurs between the digital output terminals, and
wherein each of the digital output terminals is connected to a node between the switch and a corresponding one of the potential fixers.

2. The semiconductor integrated circuit device according to claim 1,
wherein the digital output terminals are disposed adjacent to each other at an identical side of a package of the semiconductor integrated circuit device.

3. The semiconductor integrated circuit device according to claim 1
wherein the output circuits respectively include CMOS inverter circuits, and each CMOS inverter circuit has a P-channel MOSFET and an N-channel MOSFET, which are the switches and electrically connected in series between two power supply lines, and
wherein the P-channel MOSFET and the N-channel MOSFET are electrically connected in common at the digital output terminal.

4. The semiconductor integrated circuit device according to claim 3,
wherein components of the CMOS inverter circuits respectively included in the output circuits are disposed adjacent to each other inside a main part of the semiconductor integrated circuit device.

5. The semiconductor integrated circuit device according to claim 3, wherein the potential fixers respectively include current limiters, and each current limiter is configured to limit a current flowing into or flowing out of the digital output terminal through the switch, and wherein the current limiters have an identical circuit arrangement between the digital output terminal and one of the P-channel MOSFET and the N-channel MOSFET in the CMOS inverter circuit.

6. The semiconductor integrated circuit device according to claim 3, wherein the potential fixer is configured to fix the potential applied to the digital output terminal to a potential corresponding to the binary logic level for instructing an external circuit to control a system to which the digital output terminal is connected into a stopped state, in response to that the short circuit occurs between the digital output terminals.

7. The semiconductor integrated circuit device according to claim 3, wherein the potential fixers respectively include current limiters, and each current limiter is configured to limit a current flowing into or flowing out of the digital output terminal through the switch, and wherein the current limiters have identical circuit arrangement between one of the two power supply lines and the P-channel MOSFET or the N-channel MOSFET in the CMOS inverter circuit.

8. The semiconductor integrated circuit device according to claim 5, wherein the current limiter includes a resistor.

9. The semiconductor integrated circuit device according to claim 7, wherein the current limiter includes a constant current circuit configured to apply a constant current to the CMOS inverter circuit.

10. The semiconductor integrated circuit device according to claim 1, further comprising:

at least a part of a power supply circuit configured to supply a power to at least one of an internal load and an external load in the main part of the semiconductor integrated circuit device.

11. The semiconductor integrated circuit device according to claim 10, wherein the power supply circuit further includes an overcurrent protector configured to:

detect a current flowing through at least one of the internal load and the external load; and protect a function from an overcurrent in response to that a detection value exceeds a predetermined value.

12. The semiconductor integrated circuit device according to claim 11, wherein the potential fixer includes a current limiter configured to limit a current flowing into or flowing out of the digital output terminal through the switch, and wherein the overcurrent protector sets a sum of (i) a total maximum value of a load current flowing through the internal load and the external load and (ii) a current limit value limited by the current limiter in response to that the short circuit occurs between the digital output terminals to be less than a predetermined value of the detection value for overcurrent protection.

13. The semiconductor integrated circuit device according to claim 1, wherein the semiconductor integrated circuit device is sealed in a package.

14. The semiconductor integrated circuit device according to claim 1, wherein the semiconductor integrated circuit device is mounted on an in-vehicle control board and used for a vehicle control.

* * * * *